United States Patent [19]

Eda et al.

[11] 4,330,749

[45] May 18, 1982

[54] ELECTROMETER APPARATUS

[75] Inventors: Tadahiro Eda; Susumu Tatsumi; Chikara Imai, all of Tokyo, Japan

[73] Assignee: Ricoh Company, Ltd., Tokyo, Japan

[21] Appl. No.: 82,844

[22] Filed: Oct. 9, 1979

[30] Foreign Application Priority Data

Dec. 25, 1978 [JP] Japan .............................. 53-175897[U]
Mar. 6, 1979 [JP] Japan .................................. 54-25101

[51] Int. Cl.³ ............................................. G01R 5/28
[52] U.S. Cl. ..................................... 324/457; 324/458
[58] Field of Search ................. 324/457, 459, 464, 72, 324/72.5, 123, 124; 330/261

[56] References Cited

U.S. PATENT DOCUMENTS

| 3,667,036 | 5/1972 | Seachman | 324/457 |
| 3,742,377 | 6/1973 | Dobkin | 330/261 |
| 3,824,454 | 7/1974 | Stern | 324/457 |
| 4,149,119 | 4/1979 | Buchheit | 324/458 |
| 4,233,562 | 11/1980 | Blythe | 324/457 |

OTHER PUBLICATIONS

IC OP-AMP Cookbook, Walter G. Jung, Howard W. Sams and Co., 1974, pp. 20-23.

Primary Examiner—Michael J. Tokar
Attorney, Agent, or Firm—David G. Alexander

[57] ABSTRACT

An electrode (12) for sensing a surface potential is connected to a non-inverting input of an operational amplifier (14). The output of the operational amplifier (14) is connected to the inverting input thereof in a voltage follower configuration. The output of the operational amplifier (14) is also connected to one or more shield electrodes (19) which are operatively disposed adjacent to the sensing electrode (12). An offset bias voltage of the operational amplifier (14) is adjusted to cancel an input bias current thereof. An operational amplifier (33) may be mounted on a flat substrate (112), with sensing and shield electrodes (113), (114), (116) formed on the substrate (112) by printing. The shield electrodes (114), (116) surround the sensing electrode (113) and also the operational amplifier (33).

8 Claims, 20 Drawing Figures

ELECTROMETER APPARATUS

BACKGROUND OF THE INVENTION

The present invention relates to an electrometer apparatus for measuring the electrostatic potential on a surface such as a photoconductive drum in an electrostatic copying machine. The measured potential may be used to control a developing bias voltage.

An electrode is disposed closely adjacent to the surface of the photoconductive drum to sense the potential of an electrostatic image thereon. A voltage is induced in the electrode which is proportional to the electrostatic image potential and is fed to a computing circuit which generates a developing bias voltage in accordance therewith. The bias voltage which is applied to a developing unit is slightly greater than the potential of the background areas of the electrostatic image and prevents the formation of a gray background in the finished copy. Preferably, more than one electrode is provided and the minimum output of the electrodes is selected since it corresponds to the background area potential.

A problem which has existed heretofore regards the capacitances between the electrode, the drum and ground. Since the capacitance between the electrode and ground is comparable in magnitude to that between the electrode and the drum, only a fraction of the potential induced on the electrode appears at the input of an amplifier connected to the electrode. This is because the capacitances between the electrode, the drum and ground constitute a voltage divider.

Since the voltage at the input of the amplifier is only on the order of 1/100 or 1/1000 the magnitude of the electrostatic potential on the drum, a small error in the sensed voltage results in a large error in the applied bias voltage. This problem is compounded by temperature drifts and zero point shifts in the amplifier. A prior art expedient for compensating zero point shift is disclosed in U.S. Pat. No. 3,852,668 and comprises a shutter means provided to the electrode. Temperature drift has been reduced by providing the amplifier with stabilizing circuitry or mounting the amplifier in a constant temperature enclosure.

However, these expedients are only partially acceptable solutions to the problems.

The amplifier is typically an operational amplifier connected as a voltage follower. Various variables such as finite open loop gain, finite input resistance, input bias current and input offset voltage cause the output voltage to differ from the input voltage.

Some of these factors cause a constant output offset voltage which can be tolerated since it is known and can be compensated for easily. However, other factors, particularly the input bias current in combination with the capacitances between the electrode and the surface and the electrode and ground cause output voltage variations which vary as a function of time due to charging and discharging of the capacitances. This causes erratic variations in the output voltage of the operational amplifier and in the developing bias voltage.

U.S. patent application Ser. No. 17,856, filed Mar. 6, 1979, now U.S. Pat. No. 4,266,870, issued May 12, 1981, which is assigned to the same assignee as the present application discloses means for reducing the capacitance between the electrode and ground to a very low value by providing a shield around the electrode and connecting the shield to the output of the operational amplifier. The present invention improves on this prior system by providing additional means to negate the input bias current and thereby greatly improve the linearity of the amplifier.

SUMMARY OF THE INVENTION

An electrometer apparatus embodying the present invention includes an electrode, shield means operatively disposed adjacent to the electrode and an operational amplifier having a non-inverting input connected to the electrode and an inverting input connected to the shield means and to an output of the operational amplifier, and is characterized by comprising offset voltage adjusting means for adjusting an offset voltage of the operational amplifier, the adjusting means being constructed to adjust the offset voltage to a value such as to cancel an input bias current of the operational amplifier.

In accordance with the present invention, an electrode for sensing a surface potential is connected to a non-inverting input of an operational amplifier. The output of the operational amplifier is connected to the inverting input thereof in a voltage follower configuration. The output of the operational amplifier is also connected to one or more shield electrodes which are operatively disposed adjacent to the sensing electrode. An offset bias voltage of the operational amplifier is adjusted to cancel an input bias current. The operational amplifier may be mounted on a flat substrate, with the sensing and shield electrodes formed on the substrate by printing. The shield electrodes surround the sensing electrode and also the operational amplifier.

It is an object of the present invention to provide an electrometer apparatus for an electrostatic copying machine or the like comprising an operational amplifier connected as a voltage follower and means for improving the linearity of the amplifier by cancelling input bias current.

It is another object of the present invention to provide an electrometer apparatus comprising a sensing electrode and improved shield means.

It is another object of the present invention to provide an electrometer apparatus which enables extremely accurate and stable measurements of electrostatic potentials on surfaces.

It is another object of the present invention to provide a generally improved electrometer apparatus.

Other objects, together with the foregoing, are attained in the embodiments described in the following description and illustrated in the accompanying drawing.

DESCRIPTION OF THE PREFERRED EMBODIMENTS

While the electrometer apparatus of the present invention is susceptible of numerous physical embodiments, depending upon the environment and requirements of use, substantial numbers of the herein shown and described embodiments have been made, tested and used, and all have performed in an eminently satisfactory manner.

Figure 1:
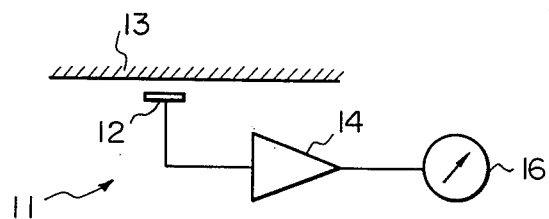
FIG. 1 is a diagram illustrating a basic electrometer apparatus embodying the present invention.

Referring now to FIG. 1 of the drawing, the general components of an electrometer apparatus 11 are illustrated as comprising an electrode 12 placed near a surface 13 on which the electrostatic potential is to be measured. A potential proportional to the potential on the surface 13 is induced in the electrode 12 and applied to the input of an amplifier 14 which has high input impedance. The output of the amplifier 14 is connected to a meter 16 which provides an indication of the potential. Alternatively, the output of the amplifier 14 may be connected to a computing circuit which provides a developing bias voltage for electrostatic copying as will be described in detail below. It is important to understand that the present electrometer apparatus may be used in other technical fields than electrostatic copying in which it is desired to measure the potential on a surface.

Figure 2:
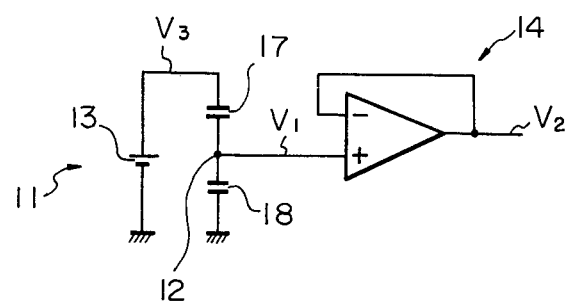
FIG. 2 is a diagram illustrating equivalent capacitances in the electrometer.

FIG. 2 shows an equivalent circuit of the apparatus 11 in which the electrode 12 is shown as a circuit point, the surface 13 as a D.C. source and the amplifier 14 as an operational amplifier having a non-inverting input connected to the electrode 12. The output of the amplifier 14 is connected directly to an inverting input thereof. In this configuration, the amplifier 14 functions as a unity gain voltage follower.

Designated by the reference numeral 17 is the capacitance between the electrode 12 and the surface 13. In a similar manner, the capacitance between the electrode 12 and ground is designated as 18. The capacitances 17 and 18 function as a voltage divider such that a voltage $V1$ at the non-inverting input of the operational amplifier 14 is related to a voltage $V3$ on the surface 13 as follows $$V1 = \frac{C1}{C1 + C2} V3 \qquad (1)$$

where $C1$ is the value of the capacitance 17 and $C2$ is the value of the capacitance 18. Since it is desired to make $V1$ as close to $V3$ as possible, means are provided to make $C1$ much larger than $C2$. Said means comprise one or more shield electrodes symbolically shown at 19 in FIG. 3 which are provided in close operative proximity to the electrode 12 and connected to the output of the amplifier 14. The shield electrodes serve the following functions.

1. Prevent leakage current from the electrode 12 to ground.
2. Reduce the capacitance $C2$ to as low a value as possible.
3. Shield the electrode 12 from external electric fields.

Figure 3:
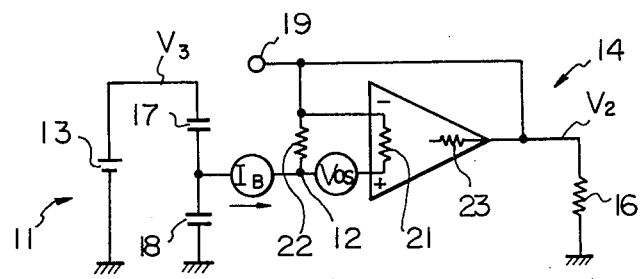
FIG. 3 is a diagram illustrating error sources in the electrometer.
Figure 4:
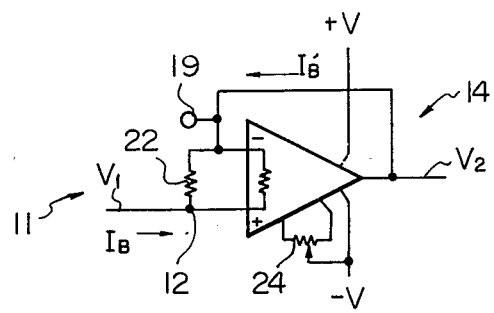
FIG. 4 is a diagram illustrating means in accordance with the present invention for cancelling an input bias current which constitutes one of the error sources.

Preferably, the amplifier 14 has an MOS-FET input stage with high input impedance and low input bias current. However, even this arrangement does not provide perfect linearity. Whereas the shield electrodes 19 reduce the capacitance $C2$ to a low value and thereby make $V1$ very closely equal to $V3$, other factors introduce errors into the amplifier 14 which make an output voltage $V2$ differ from the input voltage $V1$ thereof. These factors are illustrated in FIG. 3 in which $I_B$ is an input bias current, $V_{OS}$ is an input offset voltage, 21 is a differential input impedance of the amplifier 14, 22 is an insulation resistance between the electrode 12 and shield electrodes 19, 23 is an output impedance of the amplifier 14 and 16 is a load such as the meter illustrated in FIG. 1.

The main factors which degrade the linearity of the amplifier 14 connected in the illustrated manner are as follows.

1. Finite open loop gain

Since no real operational amplifiers have infinite open loop gain, an error is introduced as follows in which $A_V$ is the open loop gain of the amplifier 14.

$$V2 = V1\left(1 - \frac{1}{A_V}\right) \qquad (2)$$

which may be expressed as an output offset voltage $V1 - V2$ as follows $$V1 - V2 = \frac{V1}{A_V} \qquad (3)$$

Assuming a typical case in which the voltage $V1$ is 300 V and the open loop gain $A_V$ is $10^5$, $$V1 - V2 = 300/10^5 = 3 \times 10^{-3}$$

Thus, the offset voltage is 3 millivolts.

2. Input bias current

The input bias current $I_B$ is a function not only of the voltage $V1$ but also of time due to charging and discharging of the capacitances 17 and 18. Assuming that the input bias current $I_B$ has an instantaneous value of 1 picoampere and the equivalent capacitance of the capacitances 17 and 18 is 1 picofarad, the rate of change of the output voltage $V2$ is $$\frac{dV2}{dt} = \frac{1pa}{1pf} = 1 \text{ V/sec}$$

The rate of change of the output voltage V2 is 1 volt per second.

3. Input offset voltage

Since the gain of the amplifier 14 is unity, the input offset voltage $V_{OS}$ may be approximated by itself and has a typical range of ±2 millivolts ±10 millivolts.

Of these three factors, the effect of the input bias current $I_B$ is most intolerable since it varies in an erratic manner with time due to the effect of the capacitances 17 and 18. Thus, the linearity of the amplifier 14 may be greatly improved by elimination of the input bias current $I_B$.

The input bias current $I_B$ may be cancelled by applying an offset voltage V1−V2 between the noninverting input and output of the amplifier 14 which causes a compensating current $I_B'$ to flow through the resistances 21 and 22 having a magnitude equal to the input bias current $I_B$ and a direction opposite thereto. Where the input bias current $I_B$ flows into the electrode 12, the compensating current $I_B'$ also flows into the electrode 12 to cancel the current $I_B$. In this case, the offset voltage V1−V2 is negative, which means that V2 is larger than V1.

The offset voltage V1-V2 is generated within the amplifier 14 in accordance with the position of a slider of a potentiometer 24. The resistance element of the potentiometer 24 is connected between offset or null adjustment terminals of the amplifier 14 and the slider of the potentiometer 14 is connected to a negative voltage source −V. The potentiometer 24 is adjusted to make $I_B' = I_B$.

The offset null terminals are connected to the internal circuitry of the amplifier 14 so as to produce the offset voltage V1−V2 by introducing an offset voltage at one of the input terminals or producing an imbalance which results in the production of the offset voltage.

As a typical example, it will be assumed that the equivalent value of the resistances 21 and 22 is $10^{11}$ ohms and that the input bias current $I_B$ is 0.2 picoamperes. The offset voltage V1−V2 will be $$V1 - V2 = 0.2 \times 10^{-12} \times 10^{11} = 2 \times 10^{-2} \text{V}$$

Thus, the offset voltage V1−V2 will be 20 millivolts.

In accordance with the manufacturing tolerances of commercially available operational amplifiers, the direction and magnitude of the input bias current $I_B$ varies in a random manner between different devices. FIGS. 5 to 8 illustrate the four possible combinations of the direction of the input bias current $I_B$ and the polarity of the voltage V1.

Figure 5:
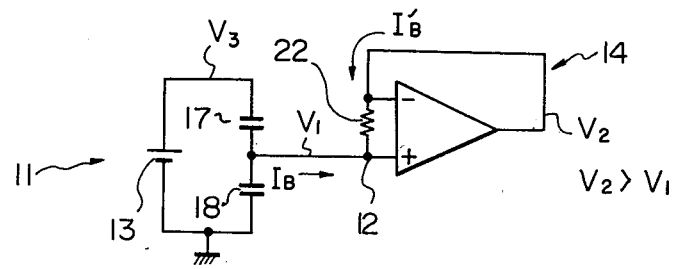
FIGS. 5 to 8 are diagrams illustrating polarities and magnitudes of input bias current and compensating current.

In FIG. 5 the voltage V1 is positive and the current $I_B$ flows into the electrode 12. Thus, the voltage V2 must be larger than the voltage V1 to cause the cancelling or compensating current $I_B'$ to flow into the electrode 12.

Figure 6:
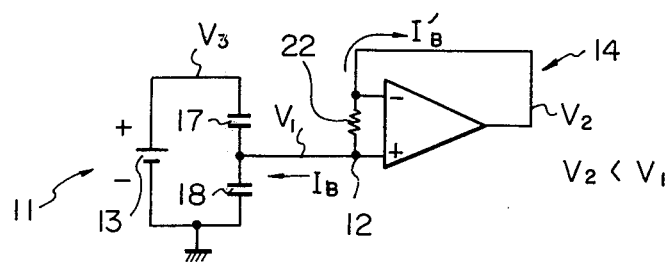

In FIG. 6 the voltage V1 is positive but the current $I_B$ flows out of the electrode 12. In this case, the voltage V2 must be lower than the voltage V1 to cause the current $I_B'$ to flow out of the electrode 12.

Figure 7:
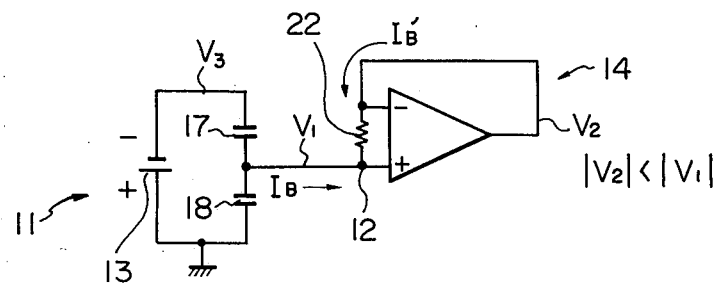

In FIG. 7 the voltage V1 is negative and the current $I_B$ flows into the electrode 12. The voltage V2 must be less negative (have a lower absolute value) than the voltage V1 to cause the current $I_B'$ to flow into the electrode 12.

Figure 8:
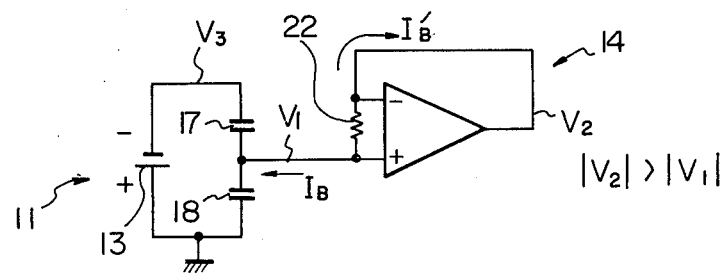

In FIG. 8 the voltage V1 is negative and the current $I_B$ flows out of the electrode 12. In this case, the voltage V2 has to be more negative (have a greater absolute value) than the voltage V1 to cause the current $I_B'$ to flow out of the electrode 12.

Figure 9:
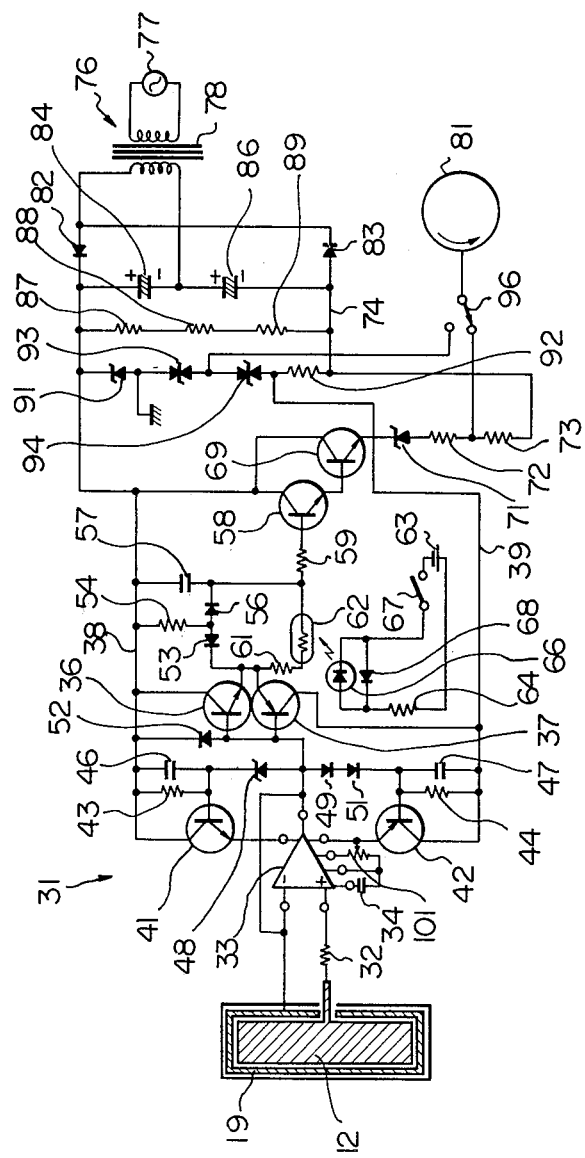
FIG. 9 is an electrical schematic diagram of a portion of an electrostatic copying machine incorporating the present electrometer apparatus.

FIG. 9 illustrates a practical embodiment of the present apparatus which is designated as 31 and comprises the electrode 12 and shield 19 described above. The electrode 12 is connected through a resistor 32 to the non-inverting input of an operational amplifier 33 which corresponds to the amplifier 14. The operational amplifier 33 is provided with a compensation capacitor 34. The output of the operational amplifier 33 is connected to the inverting input thereof, to the shield 19 and to the bases of an NPN transistor 36 and a PNP transistor 37.

The collectors of an NPN transistor 41 and a PNP transistor 42 is connected to positive and negative power supply lines 38 and 39 respectively. The emitters of the transistors 41 and 42 are connected to positive and negative supply terminals of the operational amplifier 33 respectively. The bases of the transistors 41 and 42 are connected to the lines 38 and 39 through resistors 43 and 44 in parallel with capacitors 46 and 47 respectively. The cathode of a zener diode 48 is connected to the base of the transistor 41, the anode of the zener diode 48 being connected to the output of the operational amplifier 33. The output of the operational amplifier 33 is also connected to the anode of a diode 49, the cathode of which is connected to the anode of a diode 51. The cathode of the diode 51 is connected to the base of the transistor 42. The transistors 41 and 42, zener diode 48 and associated components are included to provide high temperature stability to the power supply of the operational amplifier 33.

The base of the transistor 36 is connected to the anode of a diode 52, the cathode of which is connected to the line 38. The collectors of the transistors 36 and 37 are connected to the lines 38 and 39 respectively. The emitters of the transistors 36 and 37 are connected together and also to the cathode of a diode 53. The anode of the diode 53 is connected to the line 38 through a resistor 54 and also to the anode of a diode 56. The cathode of the diode 56 is connected to the line 38 through a capacitor 57 and also to the base of an NPN transistor 58 through a resistor 59. The emitter of the transistor 36 is connected through a resistor 61 and cadmium sulfide photocell 62 to the cathode of the diode 56.

The positive terminal of a D.C. power source 63 is connected through a resistor 64 to the anode of a light emitting diode (LED) 66. The cathode of the LED 66 is connected through a switch 67 to the negative terminal of the source 63. The cathode of a diode 68 is connected to the anode of the LED 66, with the anode of the diode 68 being connected to the cathode of the LED 66.

The emitter of the transistor 58 is connected to the base of an NPN transistor 69 in a Darlington configuration. The collectors of the transistors 58 and 69 are connected to the line 38. The emitter of the transistor 69 is connected to the cathode of a zener diode 71, the anode of which is connected through resistors 72 and 73 to a line 74.

The apparatus 31 further comprises a power supply 76 which includes an A.C. source 77. The source 77 is connected to the primary winding of a power transformer 78. One end of the secondary winding of the transformer 78 is connected to the anode of a diode 82, the cathode of the diode 82 being connected to the line 38. The anode of the diode 82 is also connected to the cathode of a diode 83, the anode of which is connected to the line 74. Capacitors 84 and 86 are connected in series between the lines 38 and 74, with the other end of the secondary winding of the transformer 78 being connected to the junction of the capacitors 84 and 86.

Resistors 87, 88 and 89 are connected in series between the lines 38 and 74. The line 38 is further connected to the cathode of a zener diode 91, the anode of which is connected to ground. The line 74 is connected to ground through a resistor 92 and varistors 93 and 94 which stabilize the power supply 76 against variations in temperature. The junction of the varistor 94 and the resistor 92 is connected to the line 39. A switch 96 is changeable to selectively connect the junction of the resistors 72 and 73 or the junction of the varistors 93 and 94 to a developing unit 81 of an electrostatic copying machine (not shown).

The diodes 82 and 83 in combination with the capacitors 84 and 86 function as a voltage doubler to provide a voltage across the lines 38 and 74 equal to twice the peak voltage across the secondary winding of the transformer 78. The zener diode 91 has a zener voltage of 6 V to 18 V so that the line 38 maintained at $+6$ V to $+18$ V according to the zener voltage. The voltage at the line 74 is maintained at about $-620$ V. The zener voltage of the zener diode 71 is on the order of 80 V.

In operation, the switch 67 is closed by a cam or the like (not shown) connected to the drum (not shown) of the copying machine when the leading edge of an electrostatic image is adjacent to the electrode 12. The switch 67 is closed long enough to allow a voltage corresponding to the leading edge potential on the drum to be induced in the electrode 12, and is then opened.

The LED 66 in combination with the cell 62 constitute an optocoupler. The resistance of the cell 62 is very high in the absence of light. However, when the switch 67 is closed the LED 66 is energized by the source 63 and emits light which renders the cell 62 highly conductive.

The amplifier 33 and transistors 36 and 37 produce an output which is equal to the voltage on the electrode 12 and which is fed back to the shield 19 as described hereinabove. This voltage appears at the emitter of the transistor 36 and is applied to the capacitor 57 through the resistor 61 and cell 62 only when the switch 67 is closed. The resistor 61 is selected to have a low value so that the capacitor 57 charges to the voltage at the emitter of the transistor 36 almost instantaneously. Where the electrostatic image has a negative polarity, the voltage at the cathode of the diode 56 is negative. When the switch 67 is opened, the charge across the capacitor 57 is held and applied to the transistor 58 which is selected to have a very high input impedance.

The transistors 58 and 69 amplify the voltage across the capacitor 57 so that it is equal to the corresponding electrostatic potential on the drum. The zener diode 71 adds 80 V to the voltage at the emitter of the transistor 69 so that the bias voltage is 80 V higher (more negative) than the electrostatic potential on the drum. This bias voltage appears at the junction of the resistors 72 and 73 and is applied to the developing unit 81 through the switch 96. The switch 96 may be changed over to connect a fixed voltage appearing at the junction of the varistors 93 and 94 to the developing unit 81 in case of failure of the automatic bias system or the like.

The diodes 53 and 56, resistor 54 and capacitor 57 constitute what is known in the art as a re-hold circuit. The purpose of this circuit is to compensate the bias voltage in case of an unusual document which has a black leading edge portion. In this case, the voltage across the capacitor 57 which is amplified to produce the bias voltage is too high and will result in washed out image areas if not corrected.

This function is accomplished by the re-hold circuit. As long as the voltage at the emitter of the transistor 36 is more negative than the voltage across the capacitor 57, indicating that the currently sensed potential is higher than the potential sensed when the switch 67 was closed, the diode 56 is reverse biased and prevents the capacitor 57 from discharging. The diode 53 functions to couple the emitter voltage of the transistor 36 to the junction of the diode 56 and resistor 54 but prevent reverse current flow to the transistor 36.

If the potential at the emitter of the transistor 36 and thereby at the anode of the diode 53 should become less negative than the voltage across the capacitor 57, which occurs when the currently sensed potential is lower than the potential sensed when the switch 67 was closed, the capacitor 56 will be forward biased and allow the capacitor 57 to discharge through the resistor 54 to the potential at the anode of the diode 53. The final potential across the capacitor 57 will be equal to the currently sensed, lower potential at the emitter of the transistor 36. If the potential at the emitter of the transistor 36 rises, the diode 56 will again be reverse biased and prevent discharge of the capacitor 57. The rate of discharge of the capacitor 57 through the resistor 54 is determined by the time constant of these components. It will thus be seen that the re-hold circuit functions to prevent the capacitor 57 from being discharged when the potential on the drum 12 is higher than the potential at the leading edge of the electrostatic image. However, if the potential on the drum 12 drops below the potential in the leading edge portion, which occurs when a document such as a photograph has a black leading edge portion, the re-hold circuit will cause the capacitor 57 to automatically discharge to a level corresponding to the sensed potential.

The zener diode 91 places the line 38 at a low positive potential, thereby allowing the amplifier 33 to operate at voltages close to zero and also at low positive voltages.

Figure 10:
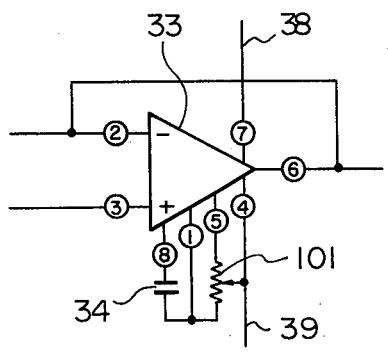
FIG. 10 is an electrical schematic diagram of an operational amplifier of the present electrometer apparatus illustrating offset voltage adjusting means.

As best seen in FIG. 10, the resistance element of a potentiometer 101 which corresponds to the potentiometer 24 is connected between offset null or adjusting terminals ① and ⑤ of the amplifier 33. The slider of the potentiometer 101 is connected to a negative source terminal ④ of the amplifier 33 which is connected to the negative line 39. The inverting input, non-inverting input, output and positive source terminals of the amplifier 33 are designated as ②, ③, ⑥ and ⑦ respectively. The capacitor 34 is connected between the terminal ① and a strobe terminal ⑧ of the amplifier 33.

Figure 11:
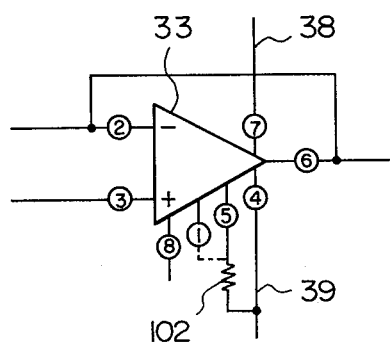
FIG. 11 is similar to FIG. 10 but illustrates an alternate method of offset voltage adjustment.

An alternate means for adjusting the offset voltage is illustrated in FIG. 11 as being in the form of a fixed resistor 102 connected between the terminal ④ and either the terminal ⑤ or the terminal ①.

Figure 12:
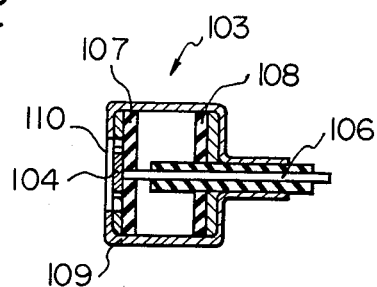
FIG. 12 is a sectional view of a prior art electrometer probe.

FIG. 12 shows a prior art probe 103 which comprises an electrode 104 corresponding in function to the electrode 12. The electrode 104 is connected to an amplifier (not shown) through a lead 106. The lead 106 and electrode 104 are supported by insulators 107 and 108 in an electrically conductive shield casing 109 which corresponds to the shield 19. The casing 109 is provided with a window or opening 110 through which the electrode 104 is able to sense the surface whose potential is to be measured. The casing 109 is connected to the output of an amplifier in the manner described above.

The probe 103 is bulky and expensive to manufacture. A more serious drawback is that it is often desired to provide a number of electrodes adjacent to different portions of a photoconductive drum to sense the potential in a number of positions. The probe 103 is too bulky to allow a relatively large number of probes 103 to be disposed in the manner desired.

Figure 13:
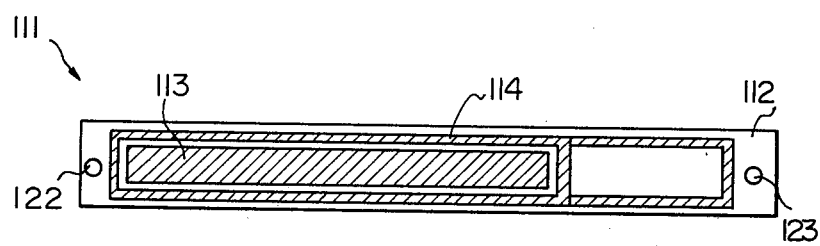
FIGS. 13 and 14 are plan views of the front surface and back surface respectively of an electrometer probe embodying the present invention.
Figure 14:
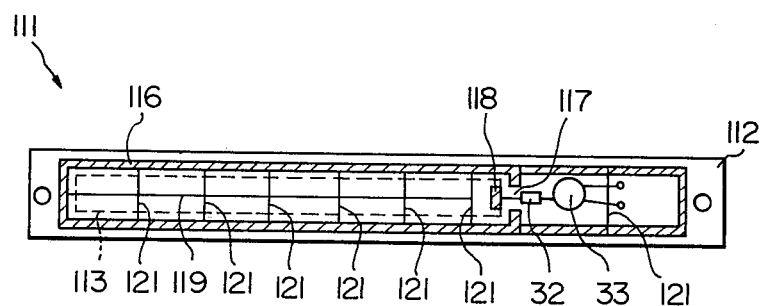

Whereas the probe 103 has a three dimensional construction, a probe 111 embodying the present invention has a two dimensional construction and is very compact and easy to manufacture. The probe 111 is shown in FIGS. 13 and 14 from the front and back sides respectively. The probe 111 comprises a flat nonconductive substrate or plate 112 made of bakelite, epoxy resin or the like. An electrode for sensing the potential on a surface is printed or vacuum deposited on the front of the substrate 112 as a flat strip 113. A shield electrode is provided in the form of a continuous flat strip 114 which surrounds the electrode 113. As seen in FIG. 14, the resistor 32 and amplifier 33 are mounted on the back side of the substrate 112. The shield 114 is extended to surround the resistor 32 and amplifier 33.

A back shield electrode 116 having the same general shape as the electrode 114 is printed on the back side of the substrate 112. However, an opening 117 is provided through the shield 116 for a wire connecting a terminal 118 extending through the substrate 112 for connection with the electrode 113 to the resistor 32.

The back shield 116 further comprises a horizontal wire member 119 and vertical wire members 12, which extend inwardly from the main part of the shield 116 as illustrated. These members 119 and 121 enhance the shielding effect on the electrode 113 and amplifier 33. Although the shield 116 may be in the form of a solid flat strip covering the entire back side of the substrate 112, the configuration shown is preferable since it minimizes the capacitance between the shield 116 and ground. The shields 114 and 116 are connected to the output of the amplifier 33 as described above.

Figure 15:
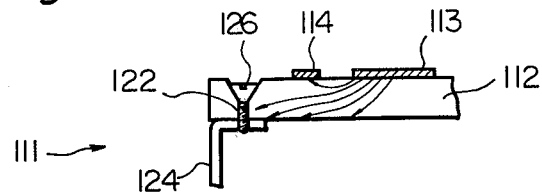
FIG. 15 is a fragmentary view illustrating mounting of the present probe.
Figure 16:
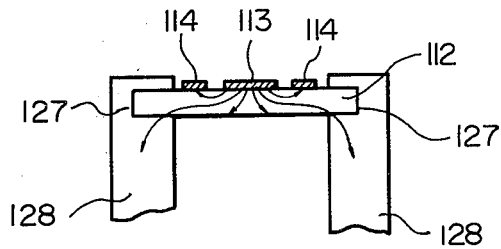
FIG. 16 is similar to FIG. 16 but illustrates another mounting method.
Figure 17:
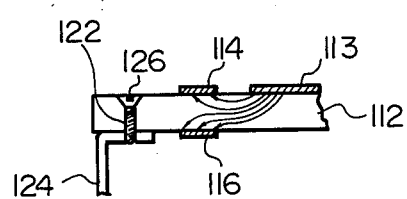
FIG. 17 is similar to FIG. 15 but illustrates an improved shield electrode arrangement.

The substrate 112 is formed with holes 122 and 123 for mounting to brackets 124 by means of screws 126, as shown in FIG. 15. An alternating mounting method is shown in FIG. 16 in which the edges of the substrate 112 fit in slots 127 formed in upstanding blocks 128. FIG. 17 shows how the back shield 116 reduces the leakage current between the electrode 113 and the brackets 124 (which are grounded) as compared with FIG. 15 in which the back shield 116 is not illustrated. Current flows from the electrode 113 to the shields 114 and 116 rather than to the brackets 124.

Figure 18:
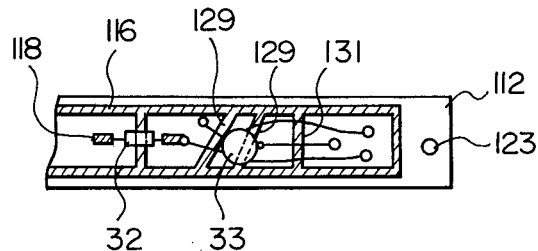
FIG. 18 is a fragmentary view of another electrometeter probe embodying the present invention.

FIG. 18 illustrates a modification of the probe 111 in which additional shield members 129 and 131 are provided in the area of the amplifier 33.

Figure 19:
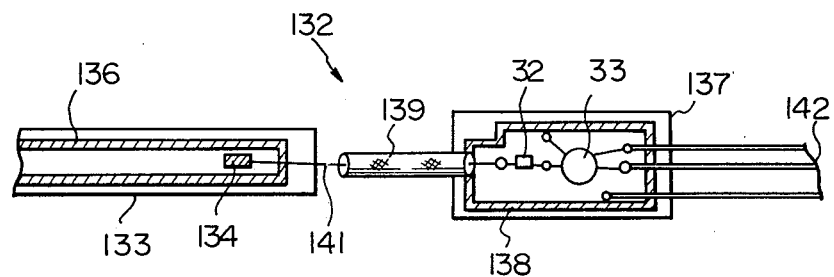
FIG. 19 is similar to FIG. 18 but illustrates another electrometer probe.

FIG. 19 illustrates another modified probe 132 comprising a substrate 133 on which is formed a sensing electrode (not visible) connected to a terminal 134. A shield electrode 136 surrounds the sensing electrode. The amplifier 33 is mounted on another substrate 137 provided with a shield electrode 138 which surrounds the amplifier 33 and resistor 32. The shield 136 is connected to the shield 138 by a coaxial mesh 139 which encloses a wire 141 connecting the terminal 134 to the resistor 32. The wire 141 and mesh 139 are as short as possible. Leads 142 are provided for connection of the amplifier 33 and shield 138 with the remainder of the apparatus in which the probe is incorporated. The probe 132 is desirable where the amplifier 33 is too large to mount on the same substrate as the sensing electrode or where the sensing electrode is desired to be very small.

Figure 20:
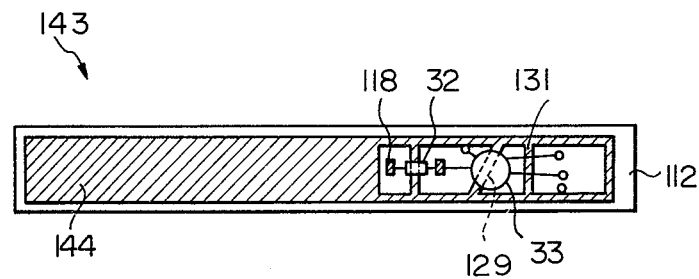
FIG. 20 illustrates yet another electrometer probe embodying the present invention.

Another probe 143 is illustrated in FIG. 20 which is similar to the probe shown in FIG. 18 except that a back shield electrode strip 144 covers substantially the entire back surface of the substrate 112 facing the electrode strip 113. Although this arrangement provides improved shielding, it does so at the expense of increasing the capacitance between the sensing electrode and ground.

It is also possible within the scope of the present invention to manufacture the substrate and all electrode strips out of transparent materials. This will allow the probe to be mounted in a position such that a light image radiated onto a photoconductive drum may pass therethrough. Also, an insulating coating may be formed on the probe to protect the same from moisture and electrical discharge.

In summary, it will be seen that the present invention provides an improved electrometer apparatus and probe assembly which enables much more stable and accurate measurement of surface potentials than has been possible in the prior art. Various modifications will become possible for those skilled in the art after receiving the teachings of the present disclosure without departing from the scope thereof. For example, the amplifier 14 or 33 may be connected in an amplifying, rather than a unity gain configuration.

What is claimed is:

1. An electrometer apparatus including an electrode, shield means operatively disposed adjacent to the electrode and an operational amplifier having a non-inverting input connected to the electrode and an inverting input connected directly to the shield means and to an output of the operational amplifier, characterized by comprising:
   offset voltage adjusting means for adjusting an offset voltage of the operational amplifier, the adjusting means being connected to adjust the offset voltage to a value such as to cancel an input bias current of the operational amplifier.

2. An apparatus as in claim 1, in which the adjusting means comprises a resistor connected between offset voltage adjusting terminals of the operational amplifier.

3. An electrometer apparatus including an electrode, shield means operatively disposed adjacent to the electrode and an operational amplifier having a noninverting input connected to the electrode and an inverting input connected to the shield means and to an output of the operational amplifier, characterized by comprising:
   offset voltage adjusting means for adjusting an offset voltage of the operational amplifier, the adjusting means being constructed to adjust the offset voltage to a value such as to cancel an input bias current of the operational amplifier;
   the shield means comprising a flat, non-conductive substrate, the electrode comprising a flat electrode strip formed on the substrate, the shield means further comprising an electrically conductive flat shield strip formed on the substrate and surrounding the electrode strip.

4. An apparatus as in claim 3, in which the operational amplifier is mounted on the substrate, the shield strip surrounding the operational amplifier.

5. An apparatus as in claim 3, in which the electrode and shield strips are formed on a front surface of the substrate, the shield means further comprising a back flat shield strip formed on a back surface of the substrate.

6. An apparatus as in claim 5, in which the back shield strip is formed outwardly of the electrode strip.

7. An apparatus as in claim 3, in which the electrode and shield strips are formed on the substrate by printing.

8. An apparatus as in claim 3, in which the substrate and electrode and shield strips are formed of transparent materials.

* * * * *